United States Patent
Nakayama et al.

(10) Patent No.: US 11,855,621 B2
(45) Date of Patent: Dec. 26, 2023

(54) SENSOR AND MANUFACTURING METHOD THEREOF

(71) Applicant: OMRON Corporation, Kyoto (JP)

(72) Inventors: Yusuke Nakayama, Kameoka (JP); Daisuke Inoue, Ayabe (JP); Yuki Ushiro, Ayabe (JP); Takaaki Sanda, Fukuchiyama (JP); Hiroto Katsura, Fukuchiyama (JP); Naomi Uehara, Ayabe (JP); Masaki Nakamura, Kyoto (JP); Toyohiro Imaizumi, Kusatsu (JP)

(73) Assignee: OMRON Corporation, Kyoto (JP)

( * ) Notice: Subject to any disclaimer, the term of this patent is extended or adjusted under 35 U.S.C. 154(b) by 409 days.

(21) Appl. No.: 17/287,112

(22) PCT Filed: Oct. 24, 2019

(86) PCT No.: PCT/JP2019/041641
§ 371 (c)(1),
(2) Date: Apr. 20, 2021

(87) PCT Pub. No.: WO2020/100545
PCT Pub. Date: May 22, 2020

(65) Prior Publication Data
US 2021/0359680 A1    Nov. 18, 2021

(30) Foreign Application Priority Data
Nov. 12, 2018    (JP) .................................. 2018-212387

(51) Int. Cl.
*H05K 5/06*    (2006.01)
*H03K 17/95*    (2006.01)
(Continued)

(52) U.S. Cl.
CPC ....... *H03K 17/9505* (2013.01); *G01D 11/245* (2013.01); *H05K 5/06* (2013.01); *G01V 8/10* (2013.01); *H03K 2017/9455* (2013.01)

(58) Field of Classification Search
CPC ....... H05K 5/06; H01H 36/00; H03K 17/9505
See application file for complete search history.

(56) References Cited

U.S. PATENT DOCUMENTS

| | | | | |
|---|---|---|---|---|
| 6,025,562 A | * | 2/2000 | Shimizu | .................. G01V 3/10 174/521 |
| 2011/0187353 A1 | * | 8/2011 | Mizusaki | ........... H03K 17/9505 324/207.11 |

FOREIGN PATENT DOCUMENTS

| | | |
|---|---|---|
| CN | 102299132 | 12/2011 |
| CN | 104908182 | 9/2015 |

(Continued)

OTHER PUBLICATIONS

"Search Report of Europe Counterpart Application", dated Jul. 22, 2022, p. 1-p. 9.
(Continued)

*Primary Examiner* — Paresh Patel
(74) *Attorney, Agent, or Firm* — JCIPRNET

(57) ABSTRACT

A sensor is provided with a cylindrical-shaped housing which has an opening formed at one end, an electronic component which is housed in the housing, a cylindrical-shaped clamp of which one end is inserted into the housing from the opening, and a sealing resin which seals the gap between the inner wall of the housing and the outer wall of the clamp. On the outer wall, the clamp has a rib which rises towards the inner wall of the housing. The rib includes an apex and a sloped surface which extends from the apex towards another end of the clamp and which intersects the outer wall of the clamp. The sealing resin, which exudes from between the inner wall of the housing and the apex and
(Continued)

which is positioned on the sloped surface, has a recess resulting from surface tension.

6 Claims, 7 Drawing Sheets

(51) Int. Cl.
*G01D 11/24* (2006.01)
*G01V 8/10* (2006.01)
*H03K 17/945* (2006.01)

(56) References Cited

FOREIGN PATENT DOCUMENTS

| CN | 107274986 | 10/2017 | |
|---|---|---|---|
| CN | 108572395 | 9/2018 | |
| DE | 102013200775 | 7/2014 | |
| DE | 102017130060 | 9/2018 | |
| EP | 0309920 A2 * | 5/1989 | ............... H05K 5/06 |
| EP | 1879294 | 1/2008 | |
| EP | 2775514 | 9/2014 | |
| JP | H0660763 | 3/1994 | |
| JP | H0992105 | 4/1997 | |
| JP | 2004153018 | 5/2004 | |
| JP | 2017092192 | 5/2017 | |

OTHER PUBLICATIONS

"International Search Report (Form PCT/ISA/210) of PCT/JP2019/041641", dated Jan. 21, 2020, with English translation thereof, pp. 1-4.

"Written Opinion of the International Searching Authourity (Form/ISA/237) of PCT/JP2019/041641", dated Jan. 21, 2020, with English translation thereof, pp. 1-8.

Rui Min, "Failure Prediction and Diagnosis Function of Limit, Proximity, and Photoelectric Sensors", New Technology & New Process, Jul. 20, 1995, pp. 9-10, vol. 4.

"Office Action of China Counterpart Application", dated May 6, 2023, with English translation thereof, pp. 1-19.

* cited by examiner

| Angle α / Viscosity | 130° | 140° | 150° |
|---|---|---|---|
| 139 mPa·s | Stopped | Stopped | Stopped |
| 108 mPa·s | Stopped | Stopped | Stopped |
| 96 mPa·s | Not stopped | Stopped | Stopped |

FIG. 7

SENSOR AND MANUFACTURING METHOD THEREOF

CROSS-REFERENCE TO RELATED APPLICATION

This application is a 371 application of the International PCT application serial no. PCT/JP2019/041641, filed on Oct. 24, 2019, which claims the priority benefits of Japan Patent Application No. 2018-212387, filed on Nov. 12, 2018. The entirety of each of the above-mentioned patent applications is hereby incorporated by reference herein and made a part of this specification.

BACKGROUND

Technical Field

The present invention relates to a sensor and a manufacturing method thereof.

Related Art

In the related art, various sensors such as proximity sensors and photoelectric sensors have been used to detect presence/absence of objects in detection areas. For example, a proximity sensor includes a coil that generates a magnetic field and detects presence/absence of an object by measuring a change in impedance of the coil due to a dielectric current generated in the object that has approached the coil. Also, a photoelectric sensor detects presence/absence of an object by emitting light from a light projecting unit to a detection area and analyzing light transmitted through or reflected by the object using a light receiving unit. These sensors may be manufactured by housing electronic components such as a coil inside a housing provided with an opening and inserting a part of a clamp that protects the electronic components into the opening.

Also, a sealing resin may be provided inside the housing to seal a gap between the housing and the clamp. At this time, there is a concern that the sealing resin with which the gap is filled may leak out of the gap between an inner wall of the housing and an outer wall of the clamp to the outside of the sensor. Thus, the leakage of the sealing resin is prevented by forming a rib that abuts on the inner wall of the housing on the outer wall of the clamp and pressing the clamp into the housing. Patent Literature 1 describes a clamp provided with a belt-shaped projection (corresponding to the rib) on the outer wall.

CITATION LIST

Patent Literature

[Patent Literature 1]
Japanese Patent Application Laid-Open No. 09-092105

SUMMARY

Technical Problem

However, there is a concern that in the aforementioned method, the sealing resin which has exuded from between the housing and the rib may leak to the outside of the sensor for some reasons such as a reason that the height of the rib is slightly smaller than a defined dimension.

Thus, an objective of the present invention is to provide a sensor capable of preventing leakage of a sealing resin from between a housing and a clamp.

Solution to Problem

A sensor according to an aspect of the present invention includes: a cylindrical-shaped housing which has an opening formed at one end; an electronic component which is housed in the housing; a cylindrical-shaped clamp of which one end is inserted into the housing from the opening; and a sealing resin which seals a gap between an inner wall of the housing and an outer wall of the clamp, on the outer wall, the clamp having a rib which rises towards the inner wall of the housing, the rib including an apex and a sloped surface which extends from the apex towards another end of the clamp and which intersects the outer wall of the clamp, and the sealing resin, which exudes from between the inner wall of the housing and the apex and which is positioned on the sloped surface, having a recess resulting from surface tension.

According to the aspect, a flow of the sealing resin stops between the inner wall of the housing and the sloped surface of the rib due to the surface tension even in a case in which the sealing resin exudes from between the inner wall of the housing and the rib. In other words, it is possible to prevent the sealing resin from leaking from between the housing and the clamp to the outside of the sensor.

In the aspect, the rib may be continuously formed along an outer circumferential direction of the clamp.

According to the aspect, it is possible to prevent leakage of the sealing resin over the entire periphery of the outer wall of the clamp.

In the aspect, a plurality of the ribs may be formed in an aligned manner in an axial direction of the clamp.

According to the aspect, it is possible to prevent leakage of the sealing resin with higher precision as compared with a case in which only one rib is formed.

In the aspect, viscosity of a sealing resin in a liquid form that solidifies and forms the sealing resin may be equal to or greater than 96 mPa·s, and the sloped surface may intersect the outer wall of the clamp at an angle of equal to or greater than 140°.

According to the aspect, it is possible to prevent leakage of the sealing resin with higher precision as compared with a case in which the viscosity of the liquid resin is equal to or less than 96 mPa·s or the sloped surface intersects the outer wall of the clamp at an angle of equal to or less than 140°.

In the aspect, the sensor may be a proximity sensor.

According to the aspect, it is possible to detect presence/absence of a detection target in a non-contact manner.

A manufacturing method of a sensor according to another aspect of the present embodiment includes: inserting an electronic component into a cylindrical-shaped housing having an opening formed at one end; inserting one end of a cylindrical-shaped clamp into the housing from the opening; and sealing a gap between an inner wall of the housing and an outer wall of the clamp with a sealing resin, on the outer wall, the clamp having a rib which rises towards the inner wall of the housing, the rib including an apex and a sloped surface which extends from the apex towards another end of the clamp and which intersects the outer wall of the clamp, and the sealing resin, which exudes from between the inner wall of the housing and the apex and which is positioned on the sloped surface, having a recess resulting from surface tension.

According to the aspect, a flow of the sealing resin stops between the inner wall of the housing and the sloped surface of the rib due to the surface tension even in a case in which the sealing resin exudes from between the inner wall of the housing and the rib. In other words, it is possible to prevent the sealing resin from leaking from between the housing and the clamp to the outside of the sensor.

Effects

According to the present invention, it is possible to provide a sensor capable of preventing leakage of a sealing resin from between a housing and a clamp.

BRIEF DESCRIPTION OF THE DRAWINGS

FIG. 7 is a table illustrating a relationship between a viscosity of a second resin and an angle of a sloped surface.

DESCRIPTION OF THE EMBODIMENTS

An embodiment of the present invention will be described with reference to the accompanying drawings. Note that components with the same reference signs applied thereto in each drawing have the same or similar configurations.

Figure 1:
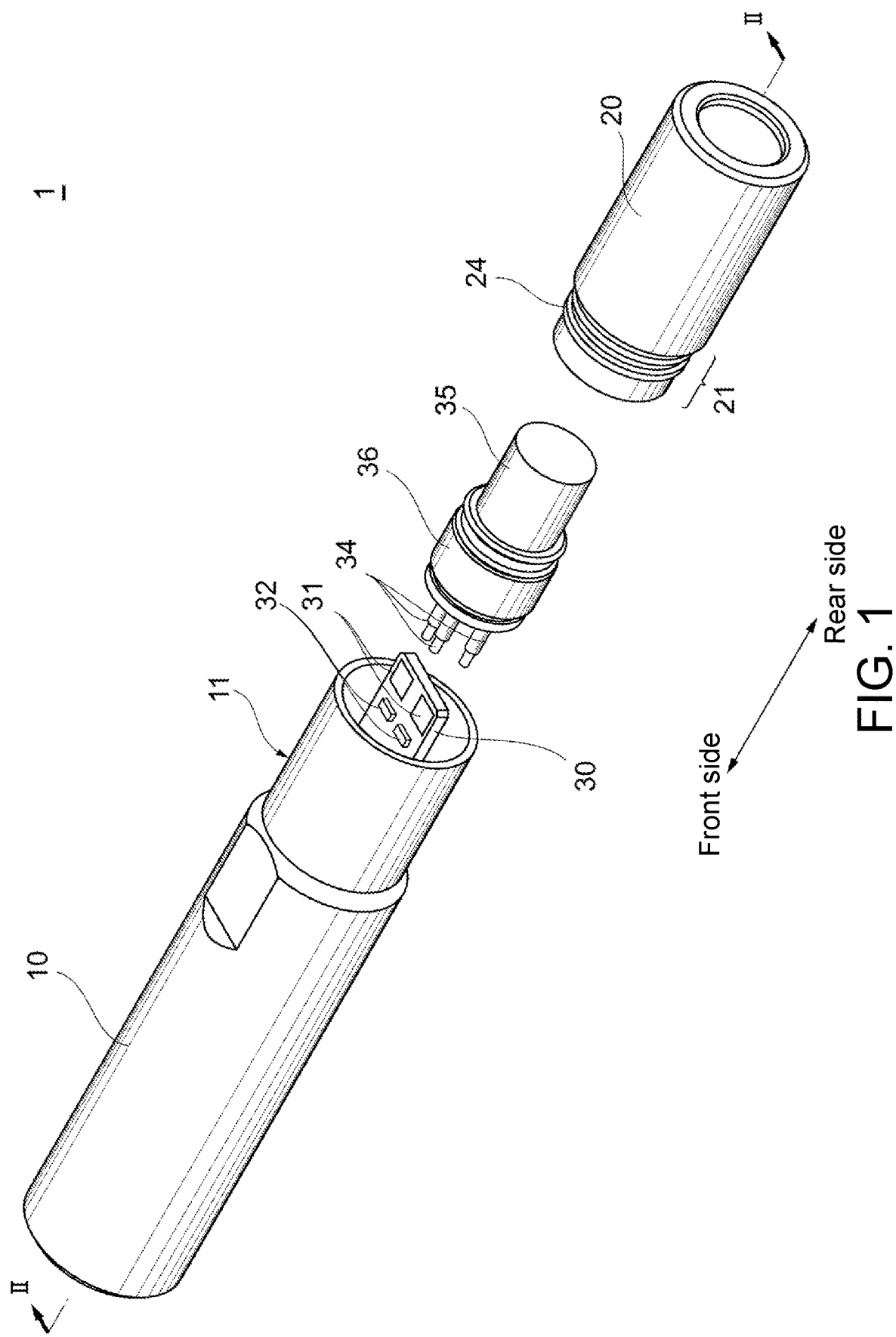
FIG. 1 is an exploded perspective view of a sensor according to an embodiment of the present invention.
Figure 2:
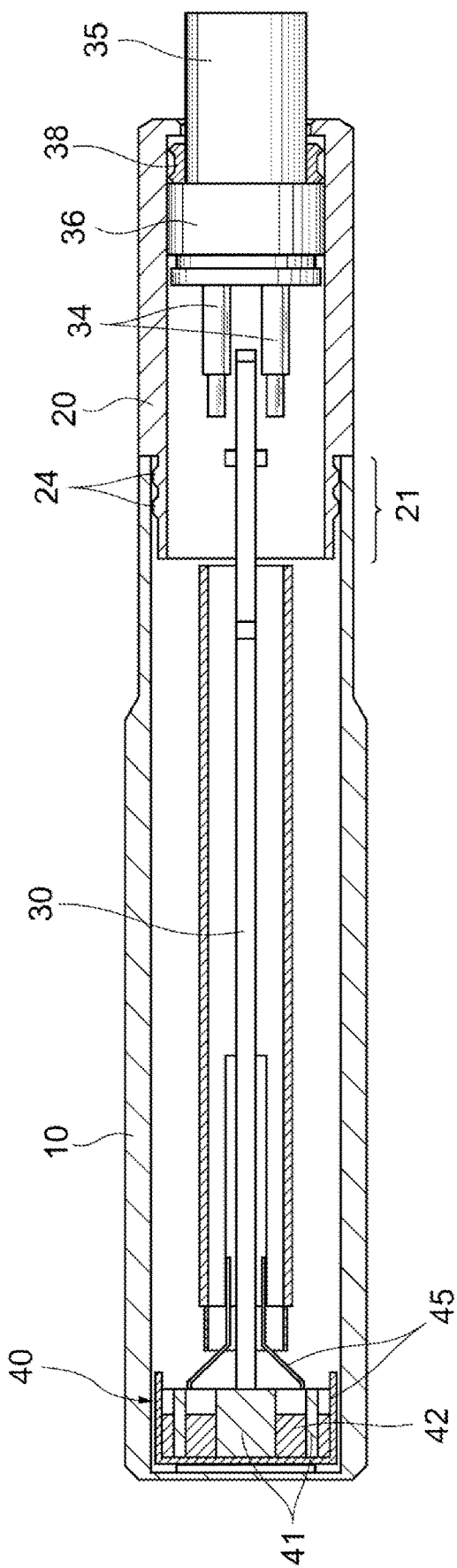
FIG. 2 is a sectional view of the sensor illustrated in FIG. 1 taken along the line II-II.

Referring to FIG. 1 and FIG. 2, an inner structure of a sensor 1 will be described. FIG. 1 is an exploded perspective view of the sensor 1 according to an embodiment of the present invention. FIG. 2 is a sectional view along the II-II in a state in which the sensor 1 illustrated in FIG. 1 has been assembled. Although a case in which the present invention is applied to a proximity sensor will be described as an example in the present specification, the present invention is not limited to the proximity sensor and can be applied to various sensors such as a photoelectric sensor.

The sensor 1 according to the present embodiment includes a housing 10, a clamp 20, a substrate 30, cable wires 34, a cable 35, a ring component 36, a detection unit 40, and a shield 45. The housing 10 is formed into a cylindrical shape, and electronic components such as a substrate 30 are housed therein. The housing 10 has an opening 11 at one end, and the electronic components such as a substrate 30 are inserted into the opening 11. The housing 10 is formed from metal, a resin, or the like. The sensor 1 has a columnar shape or may be a prism shape in which outer peripheries of the housing 10 and the clamp 20 are polygonal shapes.

An end of the clamp 20 is connected to the opening 11 of the housing 10 to protect the electronic components such as a substrate 30 housed in the housing 10. As represented by the arrow in FIG. 1, if the direction directed from the clamp 20 to the housing 10 along the axial direction of the sensor 1 is defined to be a front side, and the direction directed from the housing 10 to the clamp 20 is defined to be a rear side, a front portion 21 of the clamp 20 is inserted into the housing 10 from the opening 11 as illustrated in FIG. 2. Although a large area of the substrate 30 is housed in the housing 10, a rear area of the substrate 30 is housed in the clamp 20. Also, a part of the cable wires 34, the ring component 36, and the cable 35 is housed in the clamp 20.

Although the clamp 20 can be formed from a resin, metal, or the like, the clamp 20 is preferably formed from a transparent material through which visible light is transmitted such that a display lamp 32 located inside the sensor 1 is visible from the outside.

As illustrated in FIG. 2, the outer wall of the front portion 21 of the clamp 20 is provided with ribs 24 rising toward the inner wall of the housing 10. The ribs 24 prevent a sealing resin from leaking from between the housing 10 and the clamp 20 to the outside of the sensor 1 when the sealing resin is provided inside the sensor 1. In the present embodiment, the ribs 24 are continuously formed along an outer circumferential direction of the clamp 20. Also, two ribs 24 are formed in an aligned manner in the axial direction of the clamp 20. Note that the number of ribs 24 is not limited thereto and may be one or three or more. Details of the ribs 24 will be described later using FIG. 5.

The substrate 30 is a substrate on which a control circuit (not illustrated) for controlling the detection unit 40 and a current supply circuit (not illustrated) for supplying a current to the detection unit 40 are mounted, and a part thereof is housed in the housing 10. The detection unit 40 is attached to the end of the substrate 30 on the front side as illustrated in FIG. 2. The detection unit 40 detects presence/absence of a detection target in a non-contact manner. The detection unit 40 includes a core 41 in which a coil 42 is housed and the coil 42 wound therearound in an annular shape. On the other hand, a land 31 is provided at an end of the substrate 30 on the rear side and is electrically connected to the cable wires 34. Here, a method of detecting a detection target performed by the sensor 1 will be described. First, an excitation current is supplied from the current supply circuit mounted on the substrate 30 to the coil 42. The coil 42 generates a magnetic field on the basis of the supplied excitation current. If a detection target such as a metal target approaches the coil 42 in this state, an eddy current is generated inside the detection target due to the rule of electromagnetic induction. Since the eddy current generates a magnetic field, a magnetic flux penetrating through the coil 42 and thus an impedance of the coil 42 changes. The control circuit connected to the detection unit 40 measures the change in impedance of the coil 42 and detects presence/absence of the detection target.

The display lamp 32 that displays an operation state of the sensor 1 is mounted on the substrate 30. The display lamp 32 may be, for example, an LED. In the present embodiment, the display lamp 32 is turned on in a case in which the power of the sensor 1 is turned on or the sensor 1 detects a detection target.

The cable 35 is obtained by applying a protective coating to a plurality of cable wires 34. The cable wires 34 are electrically connected to the land 31 of the substrate 30, The cable wires 34 may supply power from an external power source to the circuits mounted on the substrate 30. Also, the cable wire 34 may transmit output signals from the control circuit mounted on the substrate 30 to external equipment such as an amplifier.

The ring component 36 is provided at an outer periphery of the cable 35 to prevent breakage of the cable 35. Specifically, the ring component 36 is formed through injection molding or the like at a position of the cable 35 where an end of the protective coating is covered. Also, the ring component 36 comes into close contact with the sealing resin provided inside the housing 10 to secure the cable 35 to the clamp 20.

A sealing ring 38 is provided in a region between the cable 35 and the clamp 20 behind the ring component 36 so as to surround the cable 35. The sealing ring 38 seals a gap between the inner wall of the clamp 20 and the outer periphery of the cable 35. The sealing ring 38 prevents liquid and dust from entering inside from the outside of the sensor 1. Also, the sealing ring 38 prevents the sealing resin provided inside the sensor 1 from leaking to the outside.

The shield 45 removes noise from the outside. The shield 45 is provided to surround a part of the detection unit 40 and the substrate 30 and prevents noise from reaching the detection unit 40 and the substrate 30. The shield 45 may be formed from a metal film, for example, or may be formed from a laminated member of a copper foil and a polyimide resin.

Figure 3:
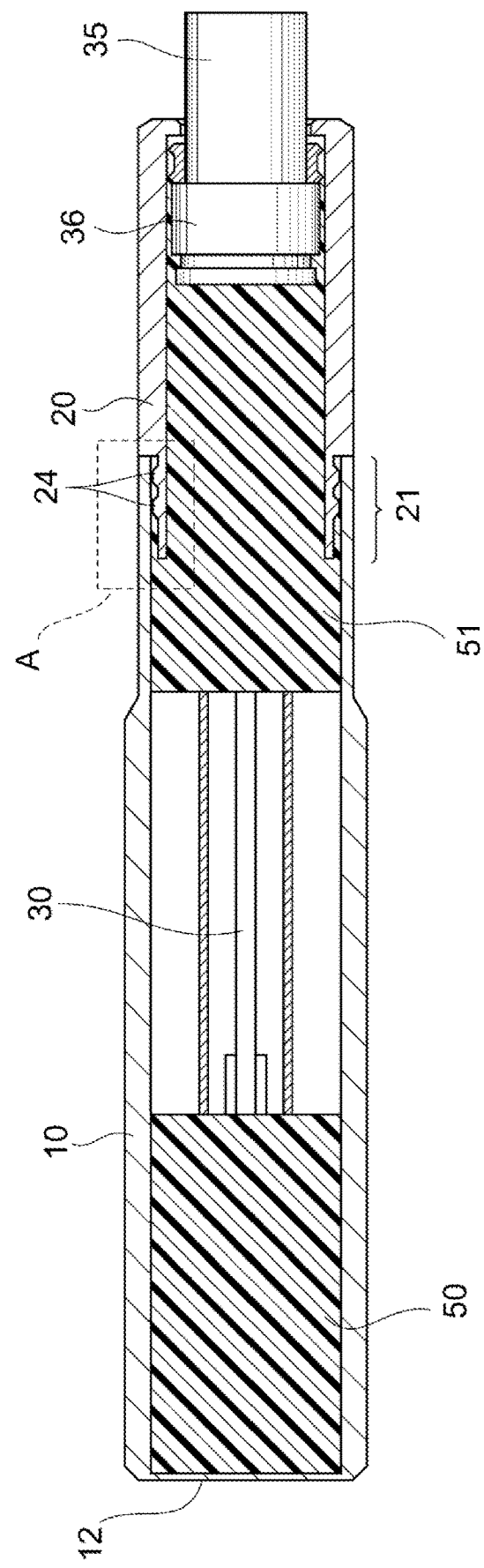
FIG. 3 is a diagram of a state in which a sealing resin is provided inside the sensor illustrated in FIG. 2.

FIG. 3 is a diagram illustrating a state in which the sealing resin (a first resin 50 and a second resin 51) are provided inside the sensor 1 illustrated in FIG. 2. Also, FIG. 4 is a diagram illustrating a process of providing the sealing resin inside the sensor 1.

The first resin 50 out of the sealing resin is provided in a front area inside the housing 10 as illustrated in FIG. 3 and covers a part of the detection unit 40 and the substrate 30. The first resin 50 secures the substrate 30 to the housing 10 and prevents positional deviation of the substrate 30. The second resin 51 is provided in a rear area inside the housing 10 and inside the clamp 20. The second resin 51 seals a gap between the housing 10 and the clamp 20 represented as a dashed-line area A. Also, a clearance where no resin is present is provided between the first resin 50 and the second resin 51.

Figure 4:
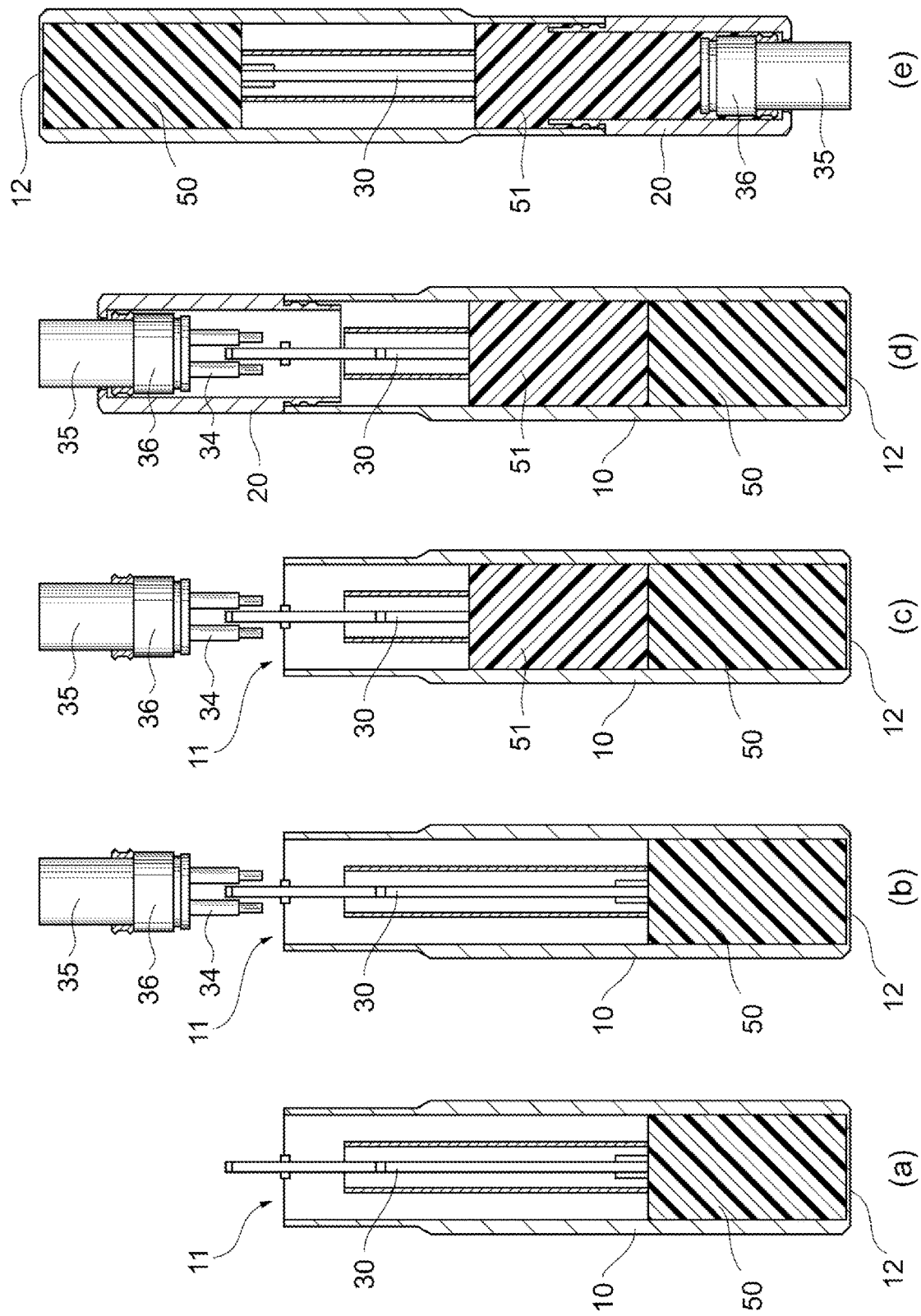
FIG. 4 is a diagram illustrating a process of providing the sealing resin inside the sensor.

Referring to FIG. 4, the process of providing the first resin 50 and the second resin 51 inside the housing 10 will be described. First, as illustrated in (a) of FIG. 4, the housing 10 is disposed such that the front surface 12 is located on the lower side, and the first resin 50 in a liquid form is poured from the opening 11 into the housing 10. Thereafter, the substrate 30 with the detection unit 40 and the shield 45 attached thereto is inserted into the housing 10. In this state, the first resin 50 is solidified, and the substrate 30 is secured to the housing 10.

Next, the cable wires 34 are connected to the land of the substrate 30 as illustrated in (b) of FIG. 4. The connection between the cable wires 34 and the land may be performed through soldering. Thereafter, the second resin 51 is poured from the opening 11 into the housing 10 as illustrated in (c) of FIG. 4.

Next, the clamp 20 is inserted into the opening 11 of the housing 10 as illustrated in (d) of FIG. 4. Before the second resin 51 is solidified, the entire sensor 1 is vertically inverted as illustrated in (e) of FIG. 4. Then, the second resin 51 moves to the side of the clamp 20 due to an influence of gravity, and a clearance is provided between the first resin 50 and the second resin 51. In this state, the second resin 51 is solidified. The sealing resin is provided inside the housing 10 by the aforementioned method. Note that the method is not limited to the aforementioned method, and the sealing resin may be provided inside the sensor 1 by a method of providing minute pores in the housing 10 or the clamp 20 and filling the inside of the sensor 1 with the sealing resin from the pores or the like.

As described above, the second resin 51 in the liquid form is poured into the sensor 1. Therefore, the second resin 51 that has been poured into the housing 10 may enter the gap between the housing 10 and the clamp 20. As illustrated in FIG. 3, the outer wall of the clamp 20 is provided with the ribs 24. The ribs 24 prevent the second resin 51 from flowing and prevents the second resin 51 from leaking from the gap between the inner wall of the housing 10 and the outer wall of the clamp 20 to the outside of the sensor 1. Here, the ribs 24 will be described using FIG. 5 and FIG. 6.

Figure 5:
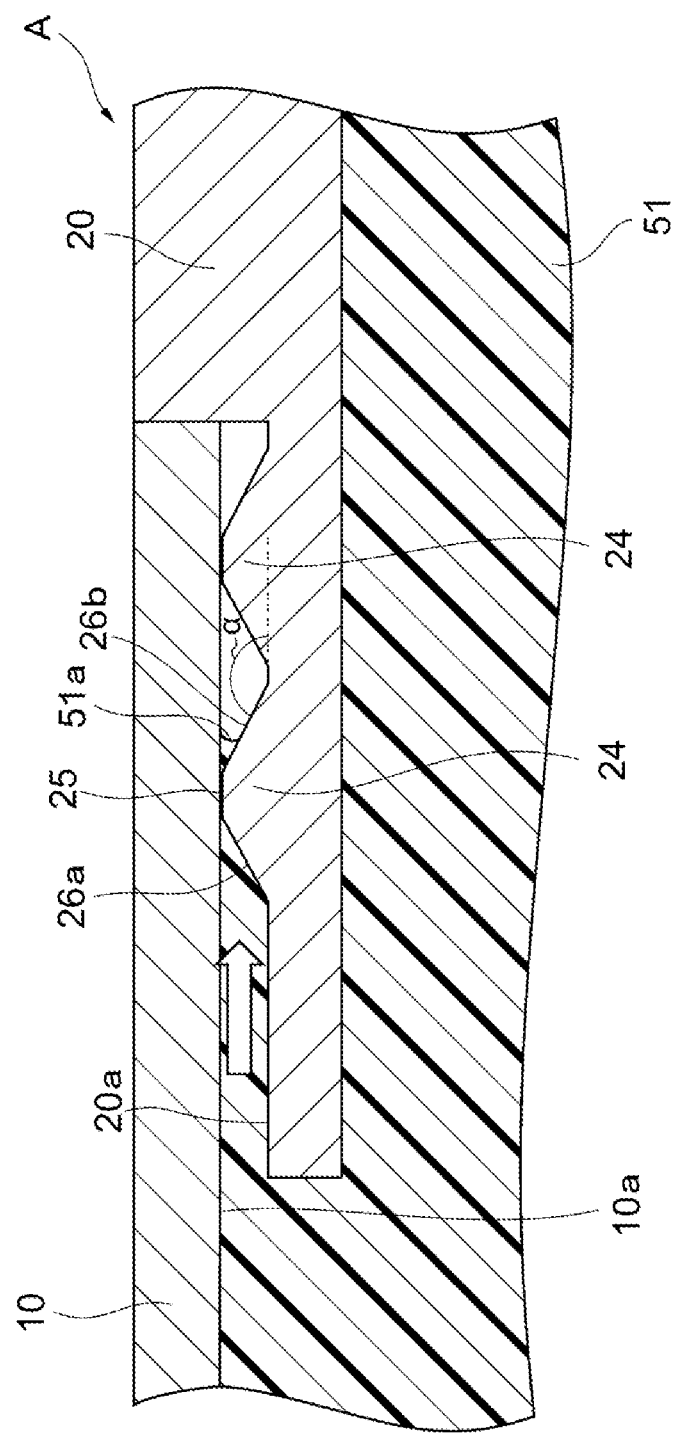
FIG. 5 is an enlarged view of a dashed-line area A illustrated in FIG. 3 and is a diagram illustrating an example of the shape of ribs.
Figure 6:
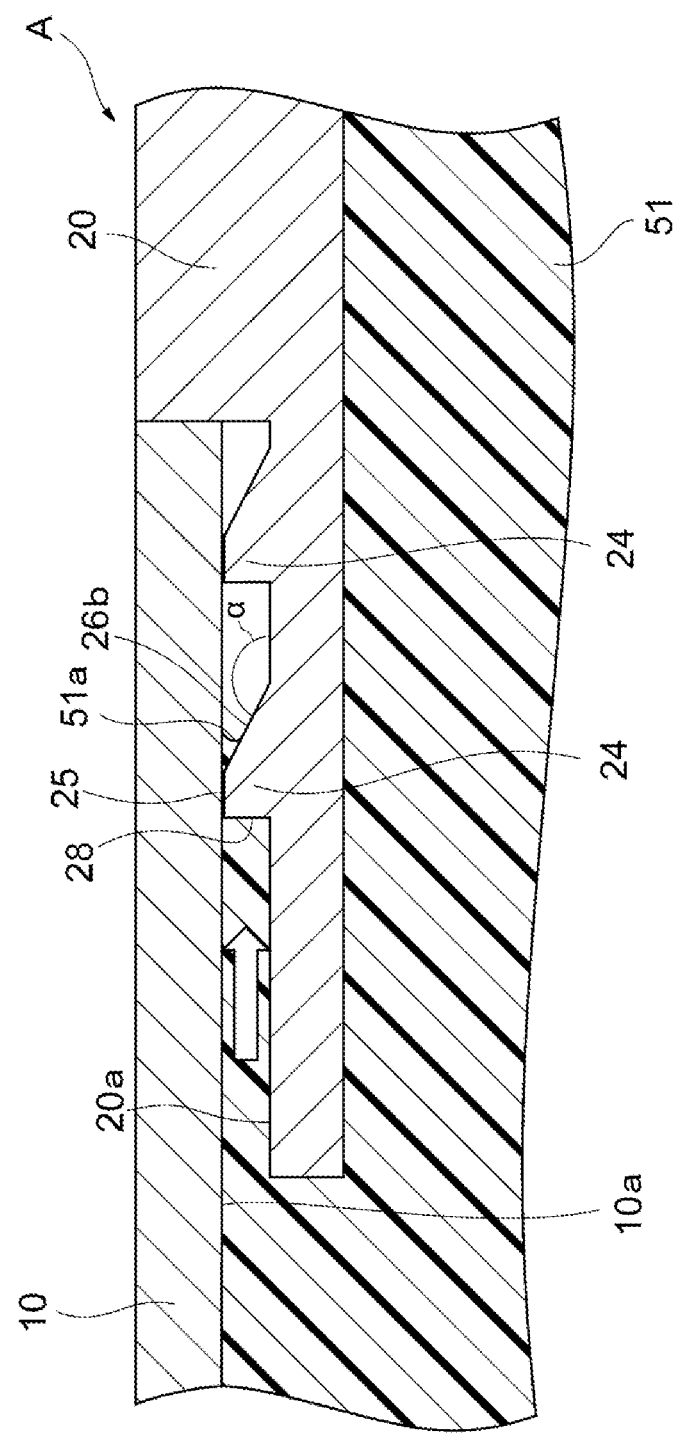
FIG. 6 is a diagram illustrating another example of the shape of the ribs.

FIG. 5 is an enlarged view of the dashed-line area A illustrated in FIG. 3 and is a diagram illustrating an example of the shape of the ribs 24. FIG. 6 is a diagram illustrating another example of the shape of the ribs 24.

As illustrated in FIG. 5, the ribs 24 rising toward the inner wall 10a of the housing 10 are formed on the outer wall 20a of the clamp 20. Each rib 24 has an apex 25 and two sloped surfaces 26a and 26b. The apex 25 is a connecting surface that connects the sloped surface 26a and the sloped surface 26b. The sloped surface 26a is a sloped surface inclined downward from the apex 25 to the front side of the sensor 1 while the sloped surface 26b is a sloped surface inclined downward from the apex 25 to the rear side of the sensor 1. Note that although two ribs 24 are formed, both the ribs 24 have a similar configuration, and the rib 24 located on the front side of the sensor 1 will thus be described as an example in the present embodiment.

As illustrated in FIG. 5, the sloped surface 26b intersects the outer wall 20a of the clamp 20 at an angle $\alpha$. The size of the angle $\alpha$ is adjusted such that a flow of the second resin 51 which has exuded from between the inner wall 10a of the housing 10 and the apex 25 stops between the inner wall 10a of the housing 10 and the sloped surface 26b due to surface tension. The size of the angle $\alpha$ is defined on the basis of the viscosity of the second resin 51 in the liquid form. A relationship between the size of the angle $\alpha$ and the viscosity of the second resin 51 will be described using FIG. 7.

The second resin 51 in the liquid form that has poured into the sensor 1 enters the gap between the inner wall 10a of the housing 10 and the outer wall 20a of the clamp 20 and moves in the arrow direction represented in FIG. 5 in the gap. Specifically, the second resin 51 moves from the sloped surface 26a toward the apex 25. As described above, the flow of the second resin 51 stops between the inner wall 10a of the housing 10 and the sloped surface 26b due to surface tension even in a case in which the second resin 51 has exuded from between the inner wall 10a of the housing 10 and the apex 25. The shape of the second resin 51 that has exuded does not project toward the advancing direction of the second resin 51 and has a recess 51a toward the inside of the second resin due to an influence of the surface tension.

The shape of the rib 24 is not limited to the shape illustrated in FIG. 5. For example, a surface of the rib 24 located on the front side (the side on which the second resin 51 enters inside) of the sensor 1 may not be the sloped surface 26a and may be a side surface 28 that substantially perpendicularly intersects the outer wall 20a of the clamp 20 as illustrated in FIG. 6. Also, although two ribs 24 are provided in the axial direction of the clamp 20 in the present embodiment, the number of ribs 24 is not limited and may be one or three or more.

FIG. 7 is a table illustrating a relationship between the viscosity of the second resin 51 and the angle $\alpha$ formed between the sloped surface 26b and the outer wall 20a of the clamp 20. The table in FIG. 7 illustrates a result of verifying whether or not a flow of the second resin 51 that has exuded stops at the gap between the inner wall 10a of the housing 10 and the sloped surface 26b with each of the viscosity of the second resin 51 and the angle $\alpha$ changed. The table illustrated in FIG. 7 shows the result of verification performed by changing the viscosity of the second resin 51 to "96 mPa·s", "108 mPa·s", and "139 mPa·s" and changing the angle of the angle α to "130°", "140°", and "150°".

As illustrated in FIG. 7, when the viscosity of the second resin 51 is 96 mPa·s and the angle α is 130°, the flow of the second resin 51 does not stop at the gap between the inner wall 10*a* of the housing 10 and the sloped surface 26*b*. On the other hand, when the viscosity of the second resin 51 is 96 mPa·s and the angle α is 140° or 150°, the flow of the second resin 51 stops at the gap between the inner wall 10*a* of the housing 10 and the sloped surface 26*b*.

In a case in which the viscosity of the second resin 51 is 108 mPa·s or 139 mPa·s, the flow of the second resin 51 stops at the gap between the inner wall 10*a* of the housing 10 and the sloped surface 26*b* regardless of which of 130°, 140°, and 150° the angle α is. In other words, it is possible to stop the flow of the resin with a lower viscosity at the gap between the inner wall 10*a* of the housing 10 and the sloped surface 26*b* as the angle α increases (as the angle formed between the inner wall 10*a* of the housing 10 and the sloped surface 26*b* is smaller). The size of the angle α and the viscosity of the resin used as the second resin 51 may be determined based on the verification result as illustrated in FIG. 7.

According to the sensor 1 in the present embodiment, the flow of the second resin 51 stops between the inner wall 10*a* of the housing 10 and the sloped surface 26*b* of each rib 24 due to surface tension even in a case in which the second resin 51 exudes from between the inner wall 10*a* of the housing 10 and the rib 24. In other words, it is possible to prevent the second resin 51 from leaking from between the housing 10 and the clamp 20 to the outside of the sensor 1.

Also, since the ribs 24 are continuously formed along the outer circumferential direction of the clamp 20, it is possible to prevent the second resin 51 from leaking over the entire periphery of the outer wall of the clamp 20. In addition, the plurality of ribs 24 are formed in an aligned manner in the axial direction of the clamp 20. Therefore, it is possible to prevent leakage of the second resin 51 with higher precision as compared with a case in which only one rib is formed.

The embodiments described above are intended for easy understanding of the present invention and are not intended for limited interpretation of the present invention. Each element and disposition, a material, a condition, a shape, a size, and the like thereof included in the embodiments are not limited to those described as examples and can be appropriately changed. Also, configurations described in different embodiments can be partially replaced or combined.

What is claimed is:

1. A sensor comprising:
   a cylindrical-shaped housing which has an opening formed at one end;
   an electronic component which is housed in the housing;
   a cylindrical-shaped clamp of which one end is inserted into the housing from the opening; and
   a sealing resin which seals a gap between an inner wall of the housing and an outer wall of the clamp,
   wherein on the outer wall, the clamp has a rib which rises towards the inner wall of the housing,
   the rib comprises an apex and a sloped surface which extends from the apex towards another end of the clamp and which intersects the outer wall of the clamp, and
   the sealing resin, which exudes from between the inner wall of the housing and the apex and which is positioned on the sloped surface, and is stopped between the inner wall of the housing and the sloped surface of the rib due to the surface tension, and the sealing resin has a recessed shape at a position where the sealing resin stopped between the inner wall of the housing and the sloped surface of the rib.

2. The sensor according to claim 1, wherein the rib is continuously formed along an outer circumferential direction of the clamp.

3. The sensor according to claim 1, wherein a plurality of the ribs are formed in an aligned manner in an axial direction of the clamp.

4. The sensor according to claim 1,
   wherein a viscosity of a sealing resin in a liquid form that solidifies and forms the sealing resin is equal to or greater than 96 mPa·s, and
   the sloped surface intersects the outer wall of the clamp at an angle of equal to or greater than 140°.

5. The sensor according to claim 1, wherein the sensor is a proximity sensor.

6. A manufacturing method of a sensor, comprising:
   inserting an electronic component into a cylindrical-shaped housing having an opening formed at one end;
   inserting one end of a cylindrical-shaped clamp into the housing from the opening; and
   sealing a gap between an inner wall of the housing and an outer wall of the clamp with a sealing resin,
   wherein on the outer wall, the clamp has a rib which rises towards the inner wall of the housing,
   the rib comprises an apex and a sloped surface which extends from the apex towards another end of the clamp and which intersects the outer wall of the clamp, and
   the sealing resin, which exudes from between the inner wall of the housing and the apex and which is positioned on the sloped surface, and is stopped between the inner wall of the housing and the sloped surface of the rib due to the surface tension, and the sealing resin has a recessed shape at a position where the sealing resin stopped between the inner wall of the housing and the sloped surface of the rib.

\* \* \* \* \*